US008869393B2

(12) United States Patent
Gentsch et al.

(10) Patent No.: US 8,869,393 B2
(45) Date of Patent: Oct. 28, 2014

(54) CONTACT PIECE FOR A VACUUM INTERRUPTER CHAMBER

(75) Inventors: Dietmar Gentsch, Bochum (DE); Günter Pilsinger, Düsseldorf (DE)

(73) Assignee: ABB Technology AG, Zürich (CH)

( * ) Notice: Subject to any disclaimer, the term of this patent is extended or adjusted under 35 U.S.C. 154(b) by 0 days.

(21) Appl. No.: 13/589,474

(22) Filed: Aug. 20, 2012

(65) Prior Publication Data

US 2012/0312785 A1 Dec. 13, 2012

Related U.S. Application Data

(62) Division of application No. 11/883,055, filed as application No. PCT/EP2006/000578 on Jan. 24, 2006, now Pat. No. 8,302,303.

(30) Foreign Application Priority Data

Jan. 27, 2005 (DE) ........................ 10 2005 003 812

(51) Int. Cl.
*H01R 43/16* (2006.01)
*H05K 3/34* (2006.01)
*H01H 33/66* (2006.01)
*H01H 33/664* (2006.01)
*H01H 11/04* (2006.01)
*H01H 1/02* (2006.01)

(52) U.S. Cl.
CPC ........... *H01H 33/664* (2013.01); *H01H 11/045* (2013.01); *H01H 1/0206* (2013.01)
USPC .................. 29/874; 29/875; 29/840; 218/118

(58) Field of Classification Search
CPC ..... H01H 33/664; H01H 33/66; H01R 43/16; H01L 2924/01079; C22C 32/0021
USPC ..................... 29/840, 874–878; 218/118–130
See application file for complete search history.

(56) References Cited

U.S. PATENT DOCUMENTS 3,721,550 A * 3/1973 Schreiner et al. ............... 419/27
3,845,543 A * 11/1974 Roth et al. .................... 228/190

(Continued)

FOREIGN PATENT DOCUMENTS

DE 1 220 212 6/1966
DE 2 032 939 1/1972

(Continued)

OTHER PUBLICATIONS

International Search Report for PCT/EP2006/000578, dated Mar. 13, 2006.

(Continued)

*Primary Examiner* — David Angwin
(74) *Attorney, Agent, or Firm* — Buchanan Ingersoll & Rooney PC

(57) ABSTRACT

A contact piece for a vacuum interrupter chamber includes at least two layers and soldering foil interposed between the at least two layers and directly contacting the closest of the at least two layers. The at least two layers are soldered to one another in a soldering furnace with the interposed soldering foil. The at least two layers are present, prior to the soldering operation, as powder-metallurgical pressed green compacts, which are sintered at the same time as the soldering operation.

18 Claims, 2 Drawing Sheets

(56) References Cited

U.S. PATENT DOCUMENTS

| | | | | | |
|---|---|---|---|---|---|
| 4,717,797 | A | * | 1/1988 | Hoene | 218/129 |
| 4,892,986 | A | * | 1/1990 | Watanabe et al. | 218/126 |
| 5,099,093 | A | * | 3/1992 | Schels et al. | 218/128 |
| 5,612,523 | A | * | 3/1997 | Hakamata et al. | 218/132 |
| 5,691,522 | A | * | 11/1997 | Schulman et al. | 218/128 |
| 5,929,411 | A | * | 7/1999 | Schulman | 218/136 |
| 6,072,141 | A | * | 6/2000 | Slamecka | 218/127 |
| 6,350,294 | B1 | * | 2/2002 | Renner et al. | 75/247 |
| 6,376,791 | B1 | * | 4/2002 | Watanabe et al. | 218/123 |
| 6,426,475 | B2 | * | 7/2002 | Watanabe et al. | 218/118 |
| 6,479,779 | B1 | * | 11/2002 | Falkingham et al. | 218/128 |
| 6,574,864 | B1 | * | 6/2003 | Meissner et al. | 29/877 |
| 6,649,855 | B2 | * | 11/2003 | Nishijima et al. | 218/128 |
| 6,686,552 | B2 | * | 2/2004 | Nishijima et al. | 218/123 |
| 6,747,233 | B1 | * | 6/2004 | Glinkowski | 218/123 |
| 6,867,385 | B2 | * | 3/2005 | Stoving et al. | 218/134 |
| 6,870,118 | B2 | * | 3/2005 | Nishijima et al. | 218/128 |
| 6,965,089 | B2 | * | 11/2005 | Stoving et al. | 218/123 |
| 7,041,929 | B2 | * | 5/2006 | Banghard et al. | 218/123 |
| 7,721,428 | B2 | * | 5/2010 | Stoving et al. | 29/874 |
| 7,781,694 | B2 | * | 8/2010 | Stoving | 218/136 |
| 8,087,166 | B2 | * | 1/2012 | Stoving et al. | 29/874 |
| 2004/0035828 | A1 | * | 2/2004 | Jianchang | 218/123 |
| 2005/0067471 | A1 | * | 3/2005 | Schenk et al. | 228/248.1 |
| 2005/0121500 | A1 | | 6/2005 | Schenk et al. | |
| 2011/0163070 | A1 | * | 7/2011 | Gentsch | 218/121 |
| 2012/0312785 | A1 | * | 12/2012 | Gentsch et al. | 218/146 |

FOREIGN PATENT DOCUMENTS

| | | | |
|---|---|---|---|
| DE | 38 40 192 | A1 | 6/1989 |
| DE | 39 31 774 | C2 | 2/1992 |
| DE | 197 53 031 | C1 | 4/1999 |
| DE | 199 02 500 | A1 | 8/2000 |
| DE | 199 07 276 | C2 | 12/2001 |
| EP | 0 677 355 | B1 | 8/1998 |
| EP | 1 111 631 | A2 | 6/2001 |
| EP | 1 111 631 | A3 | 8/2003 |
| EP | 111 631 | B1 | 6/2004 |

OTHER PUBLICATIONS

Hans Joachim Lippman, "Schalten im Vakuum," Physik-und Technik der Vakuumschalter, 2003, pp. 5 and 99-135 Umschlagbild: Siemens AG, Erlangen, ISBN 3-8007-2317-4, Berlin.

Translation of International Preliminary Report on Patentability (Form PCT/IPEA/409), in corresponding PCT Application No. PCT/EP2006/000578 European Patent Office.

* cited by examiner

CONTACT PIECE FOR A VACUUM INTERRUPTER CHAMBER

CROSS-REFERENCE TO RELATED APPLICATIONS

This application is a divisional of U.S. application Ser. No. 11/883,055 filed on Jan. 17, 2008, which is a U.S. national stage application of International Application No. PCT/EP2006/000578 filed on Jan. 24, 2006 and which claims priority to German Application No. 10 2005 003 812.3 filed on Jan. 27, 2005, the entire contents of which is incorporated herein by reference.

The invention relates to a process for producing a contact piece, in particular for use in a low-voltage, medium-voltage and high-voltage vacuum interrupter chamber in accordance with the precharacterizing clause of patent claim 1 and to a contact piece for a vacuum interrupter chamber itself in accordance with the precharacterizing clause of patent claim 12.

Interrupter chambers, in particular vacuum interrupter chambers which are used in low-voltage, medium-voltage, high-voltage and generator switching devices, are provided within the chamber housing with contact pieces, which produce the electrical contact in the closed state of the arrangement and at which a plasma arc is formed on tripping, in particular in short-circuit conditions (an arc which is burning in a vacuum atmosphere). In vacuum interrupter chambers of this type, so-called radial magnetic field contact systems are often used. In these systems, the radial magnetic field is generated via sickle-shaped coil segments, the sickle-shaped elements being produced by slots introduced into the contact piece plates.

The advantage of these radial magnetic field contact systems or of the contact pieces used therein consists in the fact that there is a low current path resistance, it being possible for a high contact pressure force to be introduced in the entire arrangement with this simple system. In this case it is also known that the radial magnetic field contact pieces used here are in the form of a cylinder disk with rounded outer edges. This serves the purpose of improving the dielectric properties.

It is prior art to use contact systems with contact pieces comprising multilayer systems. Multilayer contact pieces, in which the cross section is in the form of a double cone on the outside are likewise known. An arrangement which is advantageous per se, as is known, for example, from DE 3840192 A1, is therefore constructed from a multilayer system, in which the erosion-resistant contact layer comprises a standard contact material, for example CuCr 25, and the second layer preferably comprises pure copper. The pure copper ensures high electrical and thermal conductivity, while the CuCr layer ensures the resistance to erosion in the contact piece region itself.

Owing to the described double-cone formation, a discus-like shape results which can be produced particularly easily in the case of contact pieces having a large outer diameter and is preferably used in heavy-duty or generator circuit breaker arrangements. Thus, in addition the center of gravity of the individual contact piece sickles of the radial magnetic field contact piece can also be displaced further in the direction of the axial center, as a result of which the force occurring in the event of a mechanical switching operation brings about a lower torque at the junction with the contact piece. The resultant mechanical stresses are firstly advantageously reduced by this measure and, secondly, a longer life can be achieved in the event of frequent mechanical switching operations.

In the document described in the abovementioned document DE 38 40 192 A1, the disks, which are layered one on top of the other, are provided with slits in advance individually by means of stamping. In this case, however, care is taken to ensure that each individual disk is not thicker than its selected width for the slits which are stamped into it.

In general, multilayer contact pieces (multilayer contacts, known as MLCs), as are also known from EP 1111631, are produced in a process in which they are combined, for example, in an inert crucible (ceramic) after the sintering and melting process.

Using this as a basis, the advantage of multilayer contact systems is intended to be improved such that even relatively large layer thicknesses can be used which improve the electrical properties.

The object in question with regard to a process of the generic type is provided in accordance with the invention by the characterizing features of patent claim 1. Further advantageous configurations of the process according to the invention are specified in the dependent claims.

With regard to a contact piece for a low-voltage, medium-voltage or high-voltage vacuum interrupter, the object in question is achieved according to the invention by the characterizing features of patent claim 11.

The essence of the invention in this case consists in, in order to achieve relatively large wall thicknesses or layer thicknesses of the layers of contact pieces to be applied to one another, positioning in each case one soldering foil between the layers to be connected and heating the entire arrangement in a soldering furnace to soldering temperature, and, secondly, the desired two-layer construction (or multilayer construction, >2) can be achieved by a plurality of powder layers being layered one on top of the other. This can be achieved using the example of a two-layer contact piece by means of copper powder and the second layer comprising a mixture of copper/chromium powder being layered one on top of the other. In the latter case of powder being layered one on top of the other, the powder is compressed in a compression mold to form a compact (the green compact) and then sintered to give the finished blank in the furnace to give the finished MLC blank.

The two-layer MLC contact piece produced in the process comprises an erosion-resistant contact layer of CuCr and an in particular thick-walled copper layer lying therebeneath as the second layer having a very high conductivity. In this case, an extremely low current path resistance results as well as a good power supply to the contact outer region on which, in the event of a short-circuit current, the arc burns until the subsequent current zero crossing of the current on tripping.

In comparison with the conventional MLC processes in which an integrated sintering and melting process is required, this production process (soldering of two components to form an MLC contact piece) is quick and simple and furthermore is also considerably more efficient in the case of a multilayer construction directly via the powder layering process. In addition, large layer thicknesses in comparison with conventional processes can be achieved and used, with the result that the abovementioned advantages of low current path resistances and markedly higher mechanical loadability and the application of high switching forces are ensured. The conductivity is also further increased in this process according to the invention in comparison with the MLC sintering and melting process by virtue of the fact that, owing to the thermal treatment of the multilayer contact piece, the original conductivity of the materials used in the layers is virtually maintained. In the event of composite soldering, only the melting temperature of the solder is reached. Owing to diffusion in the soldering zone, the resistance is only increased in this narrow zone or the conductivity is reduced slightly.

Even if the multilayer construction is produced by layering the powders and compressing the powders to form the green compact and by sintering the blank, the resistance remains very low and therefore the conductivity remains at a high level.

A further advantageous configuration provides that a plurality of layers (more than two) of disks or plates can be soldered to the contact piece in the process, or can be produced in the case of powder layering. In comparison with the conventional multilayer contact process, the MLC process, this form of soldering (or else powder layering) increases the current path resistance to a markedly lesser extent in comparison with the sintering and thermal treatment process (tempering), however, with the result that the multiple arrangement of disks does not bring with it any disadvantageous influencing of the conductivity.

Moreover, it has been shown that the transition thus produced, which is produced by the soldering foil inserted between the plates and the subsequent thermal treatment in the soldering furnace, not only produces an interfacially cohesive soldered joint as such but, owing to the overall heat treatment in the soldering furnace, the solder also penetrates the boundary surfaces of the materials over a corresponding microscopic penetration depth. As a result, in terms of solid-state physics, the Fermi levels and the valence bands in the interface region are brought closer to one another without potential or without faults, with the result that metal/metal oxide imperfections do not arise there, which occurs markedly more often in the case of a sintering and melting process.

Moreover, owing to this high mechanical loadability in conjunction with the erosion resistance achieved, high closing and tripping speeds can also be run, in particular in the case of contact pieces which have a relatively large outer diameter, for example for use in high-voltage, heavy-duty and generator vacuum interrupter chambers.

A further advantageous configuration specifies that CuCr 25 is used as the erosion-resistant material.

A further alternative consists in the use of CuW. Another consists in the use of CuCrW and alternatively WCAg or else others. In principle it is true here that the upper layer is soldered to the at least one further layer, for example a copper layer, lying therebeneath in the manner according to the invention or is produced by means of powder layering. In all of these alloys used, the abovementioned property in terms of solid-state physics applies that, with this type of soldering operation or sintering process of the MLC contact blank, the current path resistance is kept low by means of a transition zone which does not have any potential discontinuities.

A further advantageous configuration specifies that slits are introduced or will be introduced in some of the contact piece layers used.

A further advantageous configuration specifies that the layers which are connected to one another in such a way are formed such that, in the ready-machined state of the contact piece, they provide a double-cone discus-like shape. This has the advantage which was described with the abovementioned dielectric properties, and therefore favors quenching of the tripping arc even when high currents are being disconnected, in particular in the edge region.

A further advantageous configuration specifies that the at least one further layer following the erosion-resistant layer is smaller in terms of diameter or, in the case of a plurality of layers, these layers become successively smaller in terms of diameter.

It is furthermore provided that the individual layers are present in terms of powder metallurgy as compressed green compacts and are sintered at the same time in the soldering operation.

The contact piece according to claims 1 ff. represents a contact piece for a medium-voltage assembly, in particular for a vacuum interrupter chamber in the low-voltage, medium-voltage and high-voltage range in accordance with the process described above.

The invention is illustrated in the drawing and described in more detail below.

Figure 1:
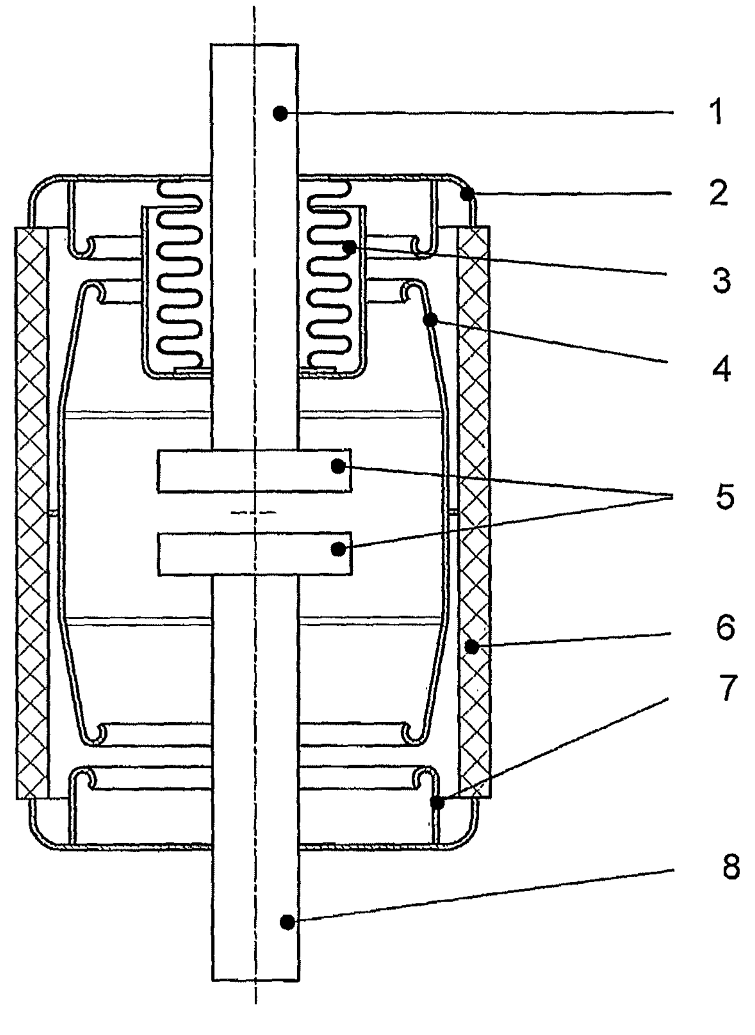
FIG. 1 shows an overall illustration of a vacuum chamber.
Figure 2:
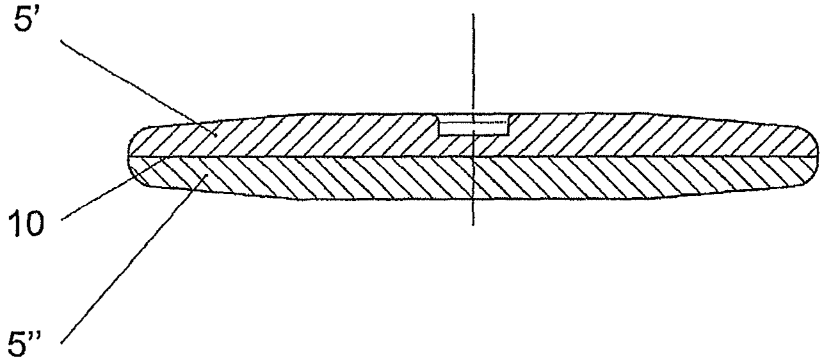
FIG. 2 shows the contact piece.

FIG. 1 shows an overall illustration of a vacuum interrupter chamber and will be shown in detail in FIG. 2 and described below. FIG. 1 shows a vacuum interrupter chamber, comprising the movable feed line 1, the vacuum interrupter chamber cover 2, which produces the vacuum-tight connection between the insulator (ceramic) 6 and the metal bellows 3. The central shield 4 controls the electrical field within and outside of the vacuum interrupter chamber and protects the insulator 6 from metal vapor. Arranged in the center of FIG. 2 are the contact pieces 5' and 5", which are advantageously in the form of an MLC contact piece as shown in FIG. 2. Arranged on the side of the fixed contact is the feed line 8, and the electric field control is taken on by the shield 7.

FIG. 2 shows the novel combination of two layers, namely an erosion-resistant first contact piece layer 5', which may comprise, for example, CuCr or the erosion-resistant materials or material alloys mentioned as alternatives above, and a further contact piece layer 5", which may comprise, for example, copper, pure or alloyed copper. The layer 10 shows, in the case of soldering of two or more layers, the soldering zone and, in the case of layering powders one on top of the other, the boundary zone between the two (or more) layers. A contact piece with optimized properties can therefore be produced, which firstly satisfies both the resistance to erosion to a certain degree and secondly also ensures a low current path resistance and a high conductivity.

When using or producing this discus shape as already described above by using double-cone or partially conical layers, which are brought together such that the contact piece overall is in the form of a double cone, i.e. with falling edges on both sides, particularly good mechanical properties can be achieved in addition to the switching properties. The contact piece is formed by two layers being layered one on top of the other with a soldering foil 10 interposed, which soldering foil 10 is then soldered to the arrangement in a soldering furnace. For example, the mechanical strength can also be further increased by soldering on a carrier plate made of steel and, in addition, a function of shielding the B field can be achieved.

LIST OF REFERENCE SYMBOLS

1 Movable feed line
2 Vacuum interrupter chamber cover
3 Bellows
4 Central shield
5 Contact pieces
5' Contact piece
5" Contact piece
6 Insulator
7 Shield
8 Feed line
10 Layer/soldering foil

The invention claimed is:

1. A contact piece for a vacuum interrupter chamber, comprising:

at least two layers; and soldering foil interposed between the at least two layers and directly contacting the closest of the at least two layers, wherein the at least two layers are soldered to one another in a soldering furnace with the interposed soldering foil, and wherein the at least two layers are present, prior to the soldering operation, as powder-metallurgical pressed green compacts, which are sintered at the same time as the soldering operation.

2. The contact piece as claimed in claim 1, wherein the at least two layers include a first contact piece layer comprising an erosion-resistant material, and a second contact piece layer comprising a copper layer having a thickness greater than or equal to a thickness of the first contact piece layer.

3. The contact piece as claimed in claim 2, wherein CuCr 25 is used as the erosion-resistant material.

4. The contact piece as claimed in claim 2, wherein CuCrW is used as the erosion-resistant material.

5. The contact piece as claimed in claim 2, wherein WCAg is used as the erosion-resistant material.

6. The contact piece as claimed in claim 2, wherein, starting from the first contact piece layer, the layers have successively smaller diameters.

7. The contact piece as claimed in claim 1, wherein at least one further contact piece layer is provided, which is soldered with a soldering foil.

8. The contact piece as claimed in claim 1, wherein at least one of the layers contains slits in the form of a radial magnetic field contact.

9. The contact piece as claimed in claim 1, wherein the layers are connected to one another such that a single-cone or double-cone discus-like shape results.

10. The contact piece as claimed in claim 2, wherein at least one further contact piece layer is provided, which is soldered with a soldering foil.

11. The contact piece as claimed in claim 2, wherein at least one of the layers contains slits in the form of a radial magnetic field contact.

12. The contact piece as claimed in claim 2, wherein the layers are connected to one another such that a single-cone or double-cone discus-like shape results.

13. The contact piece as claimed in claim 6, wherein CuCr 25 or CuCrW or WCAg is used as the erosion-resistant material.

14. The contact piece as claimed in claim 13, wherein CuCr 25 or CuCrW is used as the erosion-resistant material.

15. The contact piece as claimed in claim 14, wherein CuCr 25 is used as the erosion-resistant material.

16. The contact piece as claimed in claim 15, wherein at least one further contact piece layer is provided, which is soldered with a soldering foil.

17. The contact piece as claimed in claim 16, wherein at least one of the layers contains slits in the form of a radial magnetic field contact.

18. The contact piece as claimed in claim 17, wherein the layers are connected to one another such that a single-cone or double-cone discus-like shape results.

* * * * *